US011592885B2

(12) United States Patent
Moritomo et al.

(10) Patent No.: US 11,592,885 B2
(45) Date of Patent: Feb. 28, 2023

(54) DEVICE AND CONTROL METHOD

(71) Applicant: CANON KABUSHIKI KAISHA, Tokyo (JP)

(72) Inventors: Hiroshi Moritomo, Tokyo (JP); Kento Inai, Kanagawa (JP); Sayaka Kumon, Tokyo (JP); Hirokazu Izuoka, Kanagawa (JP); Akira Matsuo, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 3 days.

(21) Appl. No.: 17/236,915

(22) Filed: Apr. 21, 2021

(65) Prior Publication Data
US 2021/0333856 A1 Oct. 28, 2021

(30) Foreign Application Priority Data

Apr. 28, 2020 (JP) .............................. JP2020-079316

(51) Int. Cl.
*G06F 1/28* (2006.01)
*G01R 31/40* (2020.01)
*H02J 1/00* (2006.01)

(52) U.S. Cl.
CPC .............. *G06F 1/28* (2013.01); *G01R 31/40* (2013.01); *H02J 1/00* (2013.01); *G06F 2213/0042* (2013.01)

(58) Field of Classification Search
CPC .... G06F 1/28; G06F 2213/0042; G06F 1/263; G06F 1/266; G01R 31/40; G01R 31/386; G01R 31/389; G01R 31/392; H02J 1/00; H02J 7/00034; H02J 7/02; H02J 7/34; H02J 2207/30; H02J 2310/22; H04N 5/232
See application file for complete search history.

(56) References Cited

U.S. PATENT DOCUMENTS

| 2004/0008117 A1* | 1/2004 | Kawakami | ........... G01R 31/386 340/636.1 |
| 2012/0210023 A1* | 8/2012 | Ozaki | ..................... G06F 1/263 710/16 |
| 2019/0138072 A1* | 5/2019 | Kuroi | ....................... G06F 1/28 |

FOREIGN PATENT DOCUMENTS

| JP | 2002202832 A | * | 7/2002 | |
| JP | 2008244789 A | * | 10/2008 | ............. H04N 5/225 |
| JP | 2012215993 A | | 11/2012 | |
| JP | 2014015161 A | * | 1/2014 | |
| JP | 2018041170 A | * | 3/2018 | ............. G06F 1/263 |
| WO | WO-2020044597 A1 | * | 3/2020 | ............. B60L 15/20 |

* cited by examiner

*Primary Examiner* — Alexander Satanovsky
*Assistant Examiner* — Asm Fakhruddin
(74) *Attorney, Agent, or Firm* — Canon U.S.A., Inc. IP Division

(57) ABSTRACT

A device includes a load test unit that determines whether to permit startup of the device using power of a battery supplying power to the device, and a control unit that starts up the device in a case where it is determined to permit startup of the device using the battery and a first voltage is requested of a power supply apparatus to restrict power received from the power supply apparatus. The control unit cancels the restriction of the received power in a case where a notification of completion of connection is received from the power supply apparatus, after the device is started up and a second voltage is requested of the power supply apparatus.

15 Claims, 6 Drawing Sheets

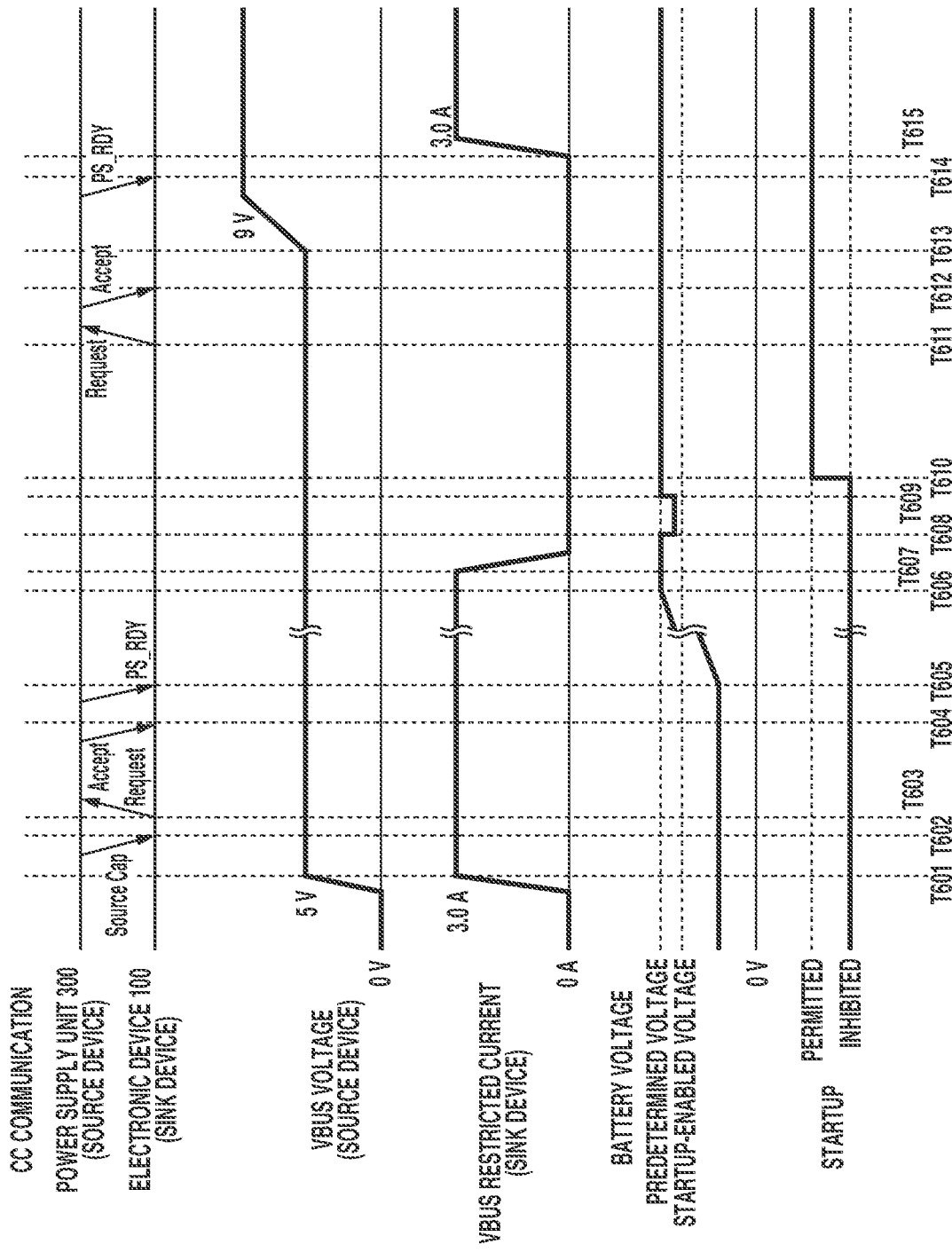

DEVICE AND CONTROL METHOD

BACKGROUND

Field of the Disclosure

Aspects of the disclosure generally relate to an electronic device that is operable with power from a power supply apparatus, and a control method of the electronic device.

Description of the Related Art

Japanese Patent Application Laid-Open No. 2012-215993 discusses an electronic device that receives power from an external device via a Universal Serial Bus (USB).

However, Japanese Patent Application Laid-Open No. 2012-215993 does not discuss the USB Type-C standard and the USB Power Delivery (PD) standard that are new standards. Devices in conformity with the USB PD standard can utilize a larger current or a higher voltage than those specified in USB Type-C standard.

In a case where an electronic device in conformity with the USB standards, the USB Type-C standard, and the USB PD standard is connected to a power supply apparatus, the electronic device performs a USB Type-C standard power supply capability detection process and a USB PD standard voltage/current determination process. The USB PD standard voltage/current determination process is performed after the USB Type-C standard power supply detection process. In the USB PD standard voltage/current determination process, there is a restriction that, if the voltage supplied from the power supply apparatus is not 5 V, power to be received from the power supply apparatus is to be kept at a predetermined value (2.5 W) or less for a predetermined time (15 ms).

However, if the electronic device is started up immediately after the termination of the USB Type-C standard power supply capability detection process, power to be received from the power supply apparatus may not be restricted to 2.5 W or less in the USB PD standard voltage/current determination process after the startup of the electronic device. If the power to be received from the power supply apparatus cannot be restricted to 2.5 W or less, the electronic device becomes short of power supply before the start of the power supply in conformity with the USB PD standard. This may cause an instantaneous interruption of power supply in the electronic device.

SUMMARY

According to an aspect of the embodiments, there is provided a device that includes a load test unit that determines whether to permit startup of the device using power of a battery supplying power to the device, and a control unit that starts up the device in a case where it is determined to permit startup of the device using the battery and a first voltage is requested of a power supply apparatus to restrict power received from the power supply apparatus. The control unit cancels the restriction of the received power in a case where a notification of completion of connection is received from the power supply apparatus, after the device is started up and a second voltage is requested of the power supply apparatus.

According to another aspect of the embodiments, there is provided a method that includes determining whether to permit startup of a device using power of a battery supplying power to the device, starting up the device in a case where it is determined to permit startup of the device using the battery and a first voltage is requested of a power supply apparatus to restrict power received from the power supply apparatus, and cancelling the restriction of the received power in a case where a notification of completion of connection is received from the power supply apparatus, after the device is started up and a second voltage is requested of the power supply apparatus.

Further aspects of the embodiments will become apparent from the following description of exemplary embodiments.

BRIEF DESCRIPTION OF THE DRAWINGS

FIG. 6 is a timing chart illustrating a process performed when the electronic device 100 and the power supply apparatus 300 are connected.

DESCRIPTION OF THE EMBODIMENTS

Exemplary embodiments, features, and aspects of the disclosure will be described below with reference to the drawings. However, aspects of the disclosure are not limited to the following embodiments.

First Exemplary Embodiment

Figure 1:
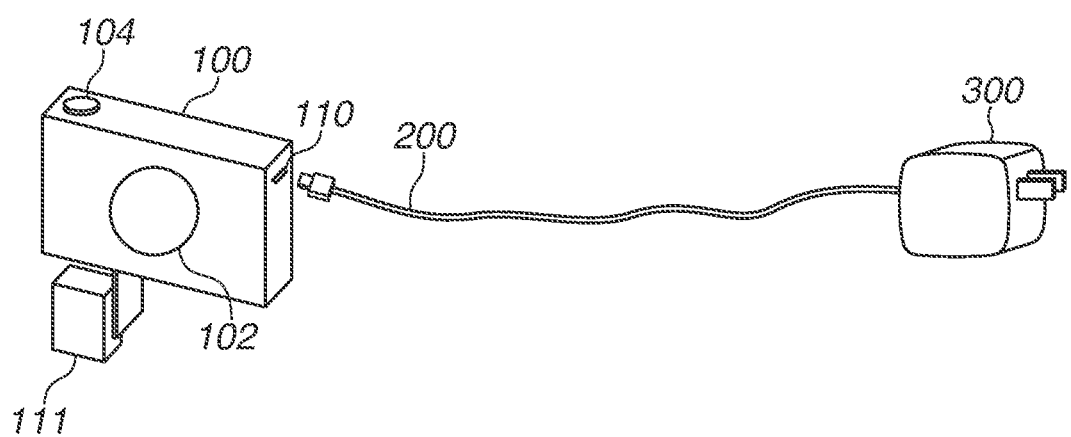
FIG. 1 is a diagram illustrating components of a power supply system in a first exemplary embodiment.

FIG. 1 is a diagram illustrating components of a power supply system in a first exemplary embodiment. As illustrated in FIG. 1, the power supply system includes an electronic device 100, a Universal Serial Bus (USB) Type-C cable 200, and a power supply apparatus 300. The electronic device 100, the USB Type-C cable 200, and the power supply apparatus 300 are all in conformity with the USB standards, the USB Type-C standard, and the USB Power Delivery (PD) standard.

The electronic device 100 is an electronic device that is operable as a digital camera, smartphone, media player, smart device, or personal computer. The electronic device 100 includes an image capture unit 102, an operation unit 104, and a connection unit 110, which will be described below. The electronic device 100 is operable with power from a detachable battery 111. The connection unit 110 is a connector in conformity with USB Type-C standard, which can receive power supply from the power supply apparatus 300 via the USB Type-C cable 200.

The power supply apparatus 300 is a power supply apparatus that is operable as an alternating current (AC) adaptor or a mobile battery. The electronic device 100 is operable with power supplied from the power supply apparatus 300 as well as power from the battery 111. From the view of the VBUS power input/output relationship in USB, the power supply apparatus 300 is a source device and the electronic device 100 is a sink device.

Figure 2:
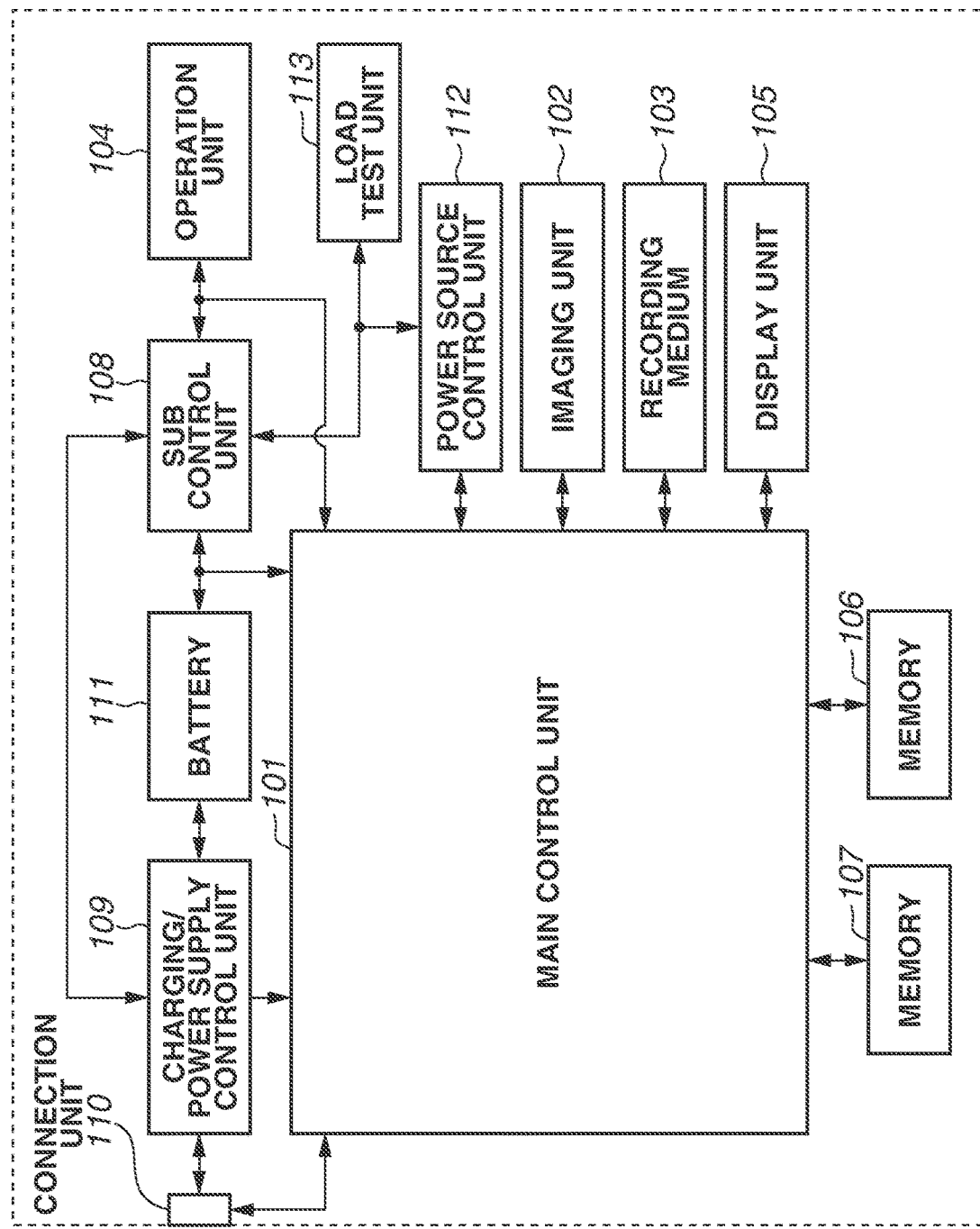
FIG. 2 is a block diagram illustrating components of an electronic device 100.

Next, components of the electronic device 100 will be described with reference to FIG. 2.

A main control unit 101 controls the components of the electronic device 100 in accordance with programs. Instead of the main control unit 101, hardware units may share processes to control the entire electronic device 100.

The image capture unit 102 converts subject light focused by a lens included in the image capture unit 102 into an electric signal, performs a noise reduction process and other processes on the electric signal to obtain digital data, and outputs the digital data as image data. The captured image data is accumulated in a buffer memory, subjected to a predetermined operation, and recorded on a recording medium 103. The recording medium 103 can record image data output from the image capture unit 102. The recording medium 103 may be removably attached to the electronic device 100 or may be built in the electronic device 100. For example, the electronic device 100 is to include a means for accessing the recording medium 103.

The operation unit 104 is used to accept instructions from the user of the electronic device 100 and sends signals to the main control unit 101 or a sub control unit 108. The operation unit 104 includes operation members, such as a power button for the user to power on or off the electronic device 100, a release switch for making an instruction for image capturing, and a zoom lever for making an instruction for zoom operation. The operation unit 104 also includes, for example, a reproducing button for making an instruction for reproduction of image data, a mode dial for specifying a startup mode of the electronic device 100, and a touch panel formed on a display unit 105 described below. The release switch has a switch (SW) 1 and a SW 2. When the release switch is half-pressed, the SW 1 is in an ON state. This allows the main control unit 101 to accept an instruction for performing preparatory processes for image capturing, such as an autofocus (AF) process, automatic exposure (AE) process, automatic white balance (AWB) process, and flash preliminary light emission (EF) process. When the release switch is fully pressed, the SW 2 is in an ON state. This allows the main control unit 101 to accept an instruction for performing image capturing.

The display unit 105 displays a viewfinder image at the time of image capturing, captured image data, characters for interactive operations, or the like. The display unit 105 may not need to be built in the electronic device 100. The electronic device 100 is to communicate with an internal or external display unit 105 and to have at least a display control function of controlling display on the display unit 105. A memory 106 is used as a buffer memory for temporarily storing the image data captured by the image capture unit 102, or the like. A memory 107 is a non-volatile memory that stores programs to be executed by the main control unit 101 or the like.

The sub control unit 108 has a processor that controls part of the electronic device 100, a random-access memory (RAM) used as a work area, and a read only memory (ROM) that stores processing procedures. The sub control unit 108 is operable with lower power consumption than the main control unit 101. The sub control unit 108 is configured to control a charging/power supply control unit 109, operate as a power control unit and perform data communication with the main control unit 101.

The charging/power supply control unit 109 supplies power received from the connection unit 110 to the components of the electronic device 100. The charging/power supply control unit 109 also charges the battery 111 with power received from the connection unit 110.

The connection unit 110 is an interface for connection with the power supply apparatus 300. The electronic device 100 can exchange data with the power supply apparatus 300 via the connection unit 110. The electronic device 100 can also receive power supply from the power supply apparatus 300 via the connection unit 110. In the first exemplary embodiment, the electronic device 100 operates as a USB device, and the connection unit 110 includes an interface connector for USB communication with the power supply apparatus 300 and a USB device controller. The main control unit 101 controls the connection unit 110 to implement the USB communication with the power supply apparatus 300 and USB charging.

The battery 111 supplies power to operate the electronic device 100. The battery 111 is removably attached to the electronic device 100 and can be charged with power received from the connection unit 110 via the charging/power supply control unit 109. The battery 111 internally has a CPU performing an authentication process, a RAM, and a ROM. The battery 111 implements the authentication process with the main control unit 101 or the sub control unit 108 of the electronic device 100.

A power source control unit 112 controls supply and shut-off of power from the battery 111 or the charging/power supply control unit 109 to the components of the electronic device 100, depending on the state of the electronic device 100. The power source control unit 112 is controlled by the main control unit 101 or the sub control unit 108.

A load test unit 113 includes a dummy load circuit for drawing a predetermined current from the battery 111 for a predetermined time period and an analog-to-digital (AD) conversion circuit that monitors a voltage for calculating the amount of a drop in the voltage supplied from the battery 111 due to the drawing of the current. In this case, the load test unit 113 is configured to draw a current of 1 A, for example. If the calculated amount of a drop in the voltage is 0.2 V, the load test unit 113 calculates the internal resistance value of the battery 111 as $0.2\Omega$ by the equation $0.2 (V) \div 1 (A) = 0.2 (\Omega)$. The load test unit 113 operates under control of the sub control unit 108. The sub control unit 108 acquires the internal resistance value of the battery 111 calculated by the load test unit 113. It is known that, if a battery is degraded, the internal resistance in the battery becomes large. The sub control unit 108 checks if the battery 111 is degraded by determining whether the internal resistance value of the battery 111 acquired from the load test unit 113 is equal to or less than a predetermined value. When the sub control unit 108 determines that the battery 111 is not degraded, the sub control unit 108 determines that the electronic device 100 is operable, and then starts up and controls the main control unit 101 to operate the electronic device 100.

Figure 3:
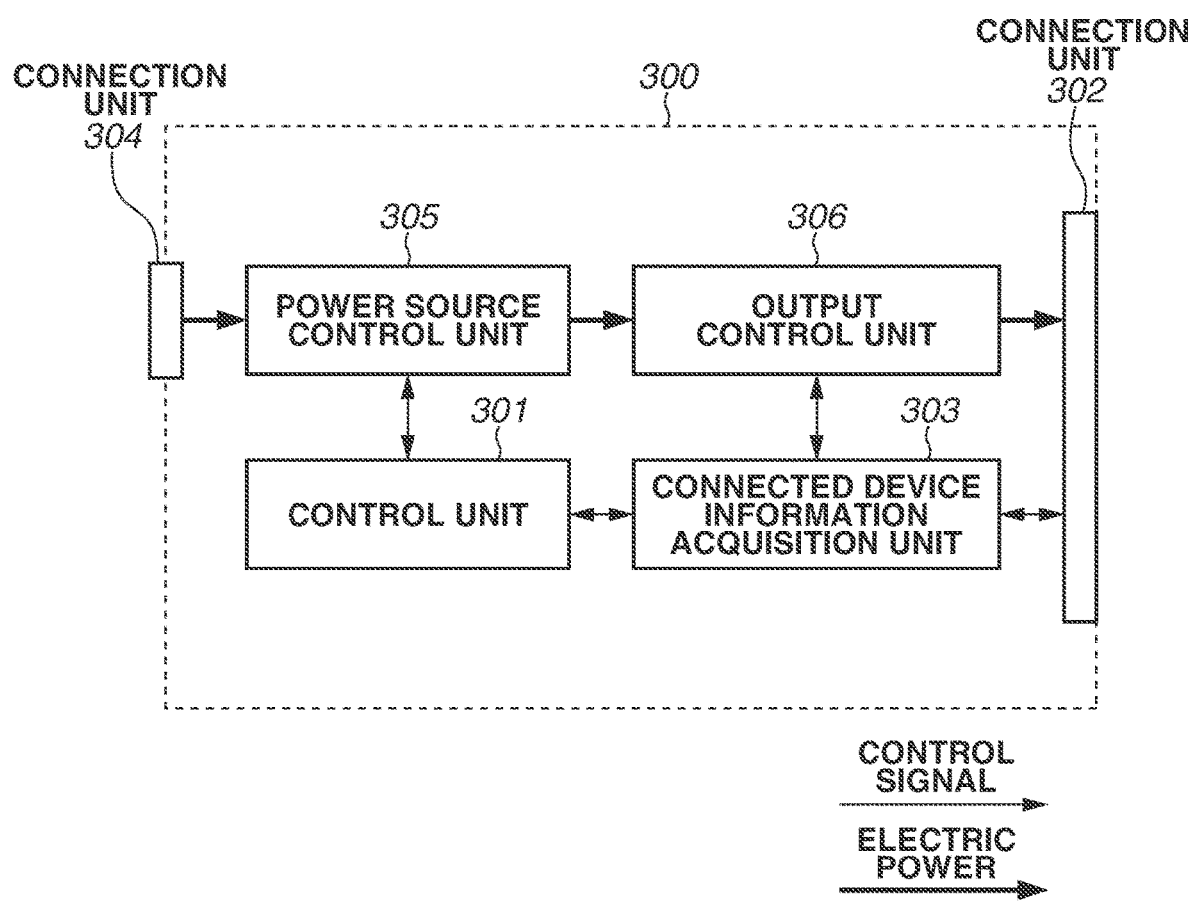
FIG. 3 is a block diagram for describing components of a power supply apparatus 300.

Next, components of the power supply apparatus 300 will be described with reference to FIG. 3.

A control unit 301 has a processor that controls the components of the power supply apparatus 300 and a memory. A connection unit 302 is an interface for connection with the electronic device 100.

A connected device information acquisition unit 303 operates as a PD communication control unit of the power supply apparatus 300. The connected device information acquisition unit 303 can detect connection with the electronic device 100 by the voltage of a configuration channel (CC) terminal and notify the electronic device 100 of the power supply capability of the power supply apparatus 300. The connected device information acquisition unit 303 can also present suppliable power to the electronic device 100 and negotiate with the electronic device 100 on requested power, through communication with the use of the CC terminal.

A connection unit 304 is connected to an external power source. A power source control unit 305 converts power obtained from the connection unit 304 into power suppliable to the electronic device 100. For example, in a case where a domestic power source (a 100-V, 50-Hz alternating-current power source) to which the connection unit 304 is connected supplies power (27 W (9 V, 3 A)) to the electronic device 100, the power source control unit 305 of the power supply apparatus 300 converts the domestic power source to output a 9-V direct current (DC) voltage. A voltage to be output is changed in accordance with a command from the control unit 301 with reference to the power supply capability obtained by the connected device information acquisition unit 303. The information on the voltage and current that can be output by the power source control unit 305 constitutes the information on the suppliable power of the power supply apparatus 300.

An output control unit 306 is connected to a VBUS terminal of the connection unit 302. The output control unit 306 supplies or shut off power from the power source control unit 305 to the external electronic device 100 via the VBUS terminal. The output control unit 306 is controlled by the connected device information acquisition unit 303 to output or shut off power at timings in conformity with USB PD standard.

Figure 4:
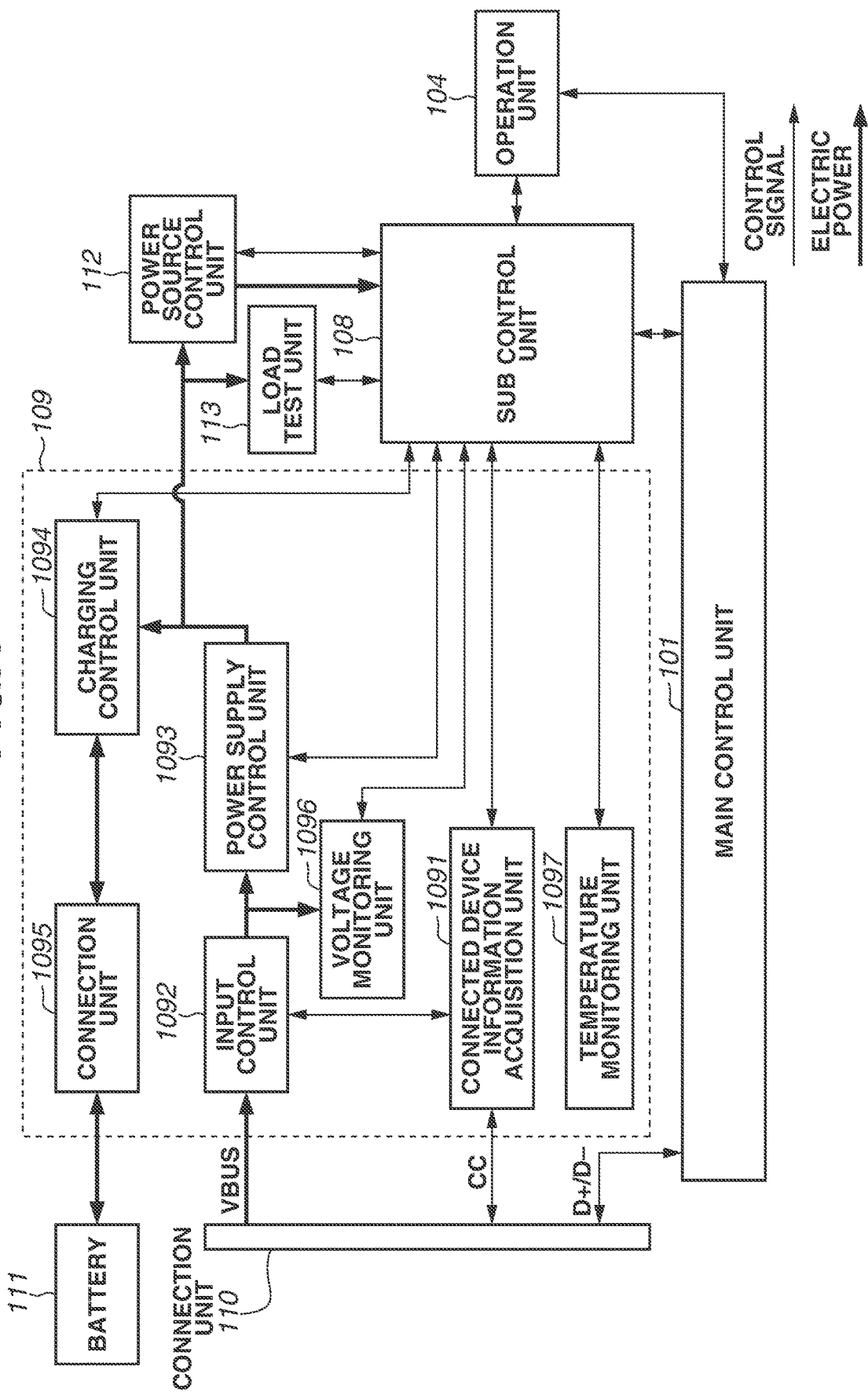
FIG. 4 is a block diagram illustrating components of a charging/power supply control unit 109 included in the electronic device 100.

Next, components of the charging/power supply control unit 109 included in the electronic device 100 will be described with reference to FIG. 4.

A connected device information acquisition unit 1091 is connected to a CC terminal of the connection unit 110 and operates as a PD communication control unit. The connected device information acquisition unit 1091 can detect the power supply capability of the power supply apparatus 300 by a CC terminal voltage and negotiate with the power supply apparatus 300 on power to be supplied through communication with the use of the CC terminal.

An input control unit 1092 is connected to the VBUS terminal of the connection unit 110 and switches between supplying and shutting off power received from the power supply apparatus 300 to the power supply control unit 1093. The input control unit 1092 is controlled by the connected device information acquisition unit 1091 to output or shut off power at timings in conformity with USB PD standard. Alternatively, the input control unit 1092 is controlled to output or shut off power through communication from the sub control unit 108 to the connected device information acquisition unit 1091.

The power supply control unit 1093 performs control to convert the VBUS voltage supplied via the input control unit 1092 into a voltage receivable by the power source control unit 112 and a charging control unit 1094. In the first exemplary embodiment, the battery 111 is formed of two cells and thus the power supply control unit 1093 raises or lowers the 5-V or 9-V voltage into a voltage suited for charging the battery 111 and operation of the power source control unit 112. The battery 111 may be formed of one cell or three or more cells. The power supply control unit 1093 is not limited to the configuration in the first exemplary embodiment as far as the power supply control unit 1093 can convert power into an appropriate voltage depending on the configuration of the battery 111 and the voltage supplied via the input control unit 1092.

The power supply control unit 1093 can also restrict the suppliable current based on the power supply capability of the power supply apparatus 300 obtained by the connected device information acquisition unit 1091, in accordance with an instruction from the sub control unit 108. For example, if the power supply capability of the power supply apparatus 300 is 27 W (9 V, 3 A), the power supply control unit 1093 converts the supplied voltage of 9V into a voltage receivable by the power source control unit 112 and the charging control unit 1094 and controls power such that a current of 3.0 V or more is not drawn.

The charging control unit 1094 can charge the battery 111 connected to the connection unit 1095 with power received from the VBUS terminal via the input control unit 1092 and the power supply control unit 1093. The charging control unit 1094 implements constant current charging (CC charging) or constant voltage charging (CV charging) while controlling the voltage and the current so as not to cause damage to the battery 111.

The connection unit 1095 can be connected to the battery 111 that is insertable and removable. The connection unit 1095 is connected to a power source terminal for power supply, a ground (GND) terminal, a connection terminal to an authentication circuit of the battery 111, and a thermistor terminal built in the battery 111.

A voltage monitoring unit 1096 monitors the voltage of the input VBUS power and notifies the acquired voltage to the sub control unit 108. For example, if the power supply capability of the power supply apparatus 300 is 27 W (9 V, 3 A), the voltage monitoring unit 1096 monitors whether the power supply apparatus 300 outputs a voltage higher than expected (e.g., 15 V). Alternatively, the voltage monitoring unit 1096 monitors whether the output from the power supply apparatus 300 has significantly fallen below 9 V due to a short caused by an abnormal state in the electronic device 100. In one embodiment, the sub control unit 108 instructs the input control unit 1092 to stop and instructs the power supply apparatus 300 to stop the output via the connected device information acquisition unit 1091.

A temperature monitoring unit 1097 monitors the temperature around the connection unit 110 and notifies the temperature to the sub control unit 108. For example, the temperature monitoring unit 1097 monitors whether the connection unit 110 has generated heat due to a foreign matter intruded into a connecting portion between the electronic device 100 and a cable 200 at the connection unit 110 and has reached a temperature that may cause users harm. In one embodiment, the sub control unit 108 instructs the input control unit 1092 to stop and instructs the power supply apparatus 300 to stop the output, via the connected device information acquisition unit 1091.

Figure 5:
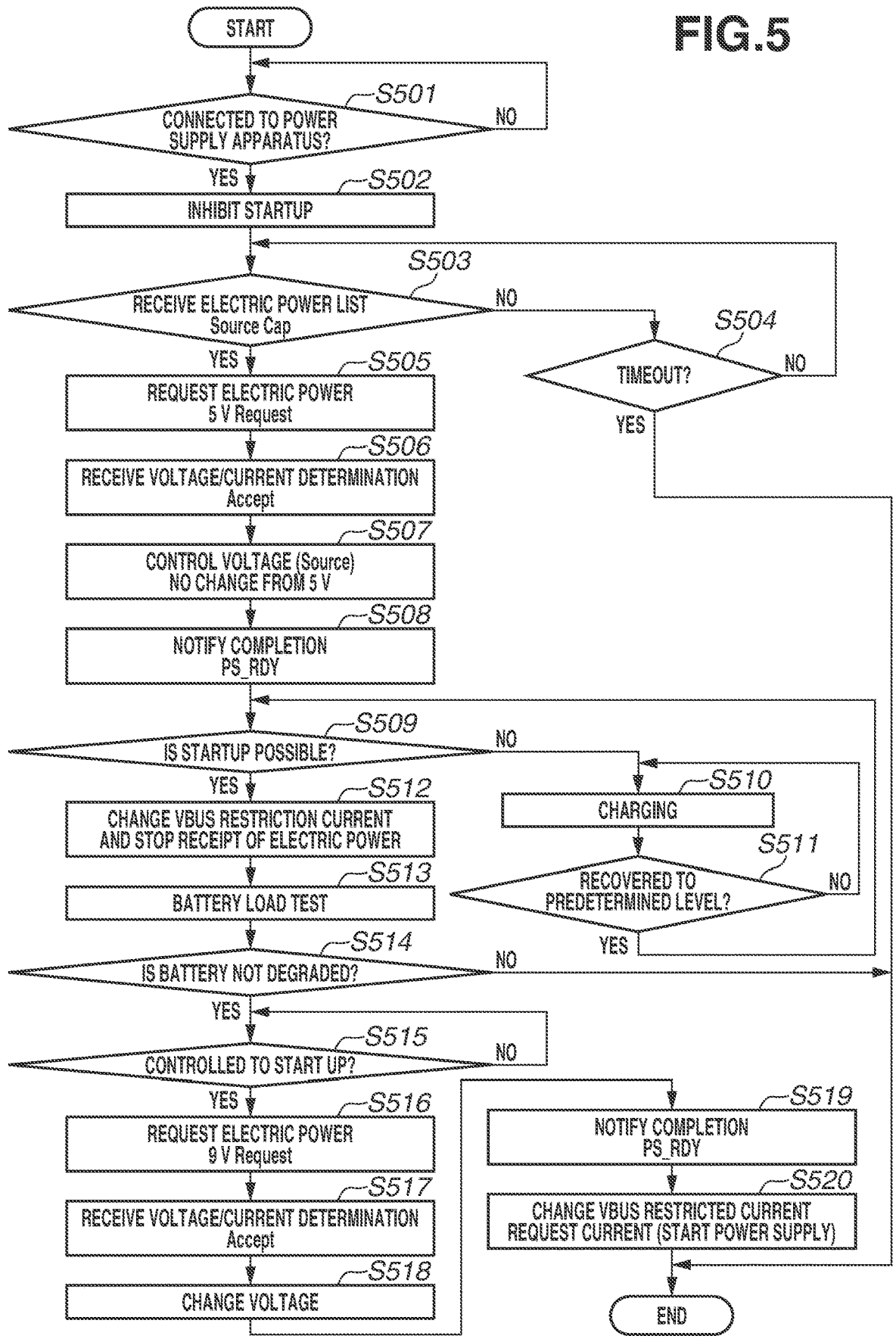
FIG. 5 is a flowchart illustrating a process performed when the electronic device 100 and the power supply apparatus 300 are connected.

FIG. 5 is a flowchart illustrating a process performed when the electronic device 100 is connected to the power supply apparatus 300 via the cable 200. The process in the flowchart illustrated in FIG. 5 is implemented by the sub control unit 108 of the electronic device 100 when the sub control unit 108 controls the components of the electronic device 100 in accordance with an input signal or program. The process in the flowchart illustrated in FIG. 5 is started after the power supply apparatus 300 is connected to the connection unit 110 of the electronic device 100.

FIG. 6 is a timing chart illustrating a process performed when the electronic device 100 is connected to the power supply apparatus 300 via the cable 200. FIG. 6 illustrates, from the top, a communication signal from the connected device information acquisition unit 303 of the power supply apparatus 300, and a communication signal from the connected device information acquisition unit 1091 of the electronic device 100. FIG. 6 then illustrates a voltage level at which the VBUS power is output from the power source control unit 305 of the power supply apparatus 300 and then supplied to the connection unit 110 of the electronic device 100 via the cable 200 (hereinafter, referred to as VBUS voltage). FIG. 6 subsequently illustrates the value of a VBUS current restricted by the power supply control unit 1093 of the electronic device 100 (hereinafter, referred to as VBUS restricted current). FIG. 6 then illustrates a voltage level of the battery 111 detected by the load test unit 113 of the electronic device 100 (hereinafter, referred to as battery voltage). FIG. 6 finally illustrates whether the sub control unit 108 permits or inhibits the startup of the electronic device 100.

Hereinafter, referring to FIG. 6, the process performed when the electronic device 100 is connected to the power supply apparatus 300 via the cable 200 illustrated in FIG. 5 will be described. In the first exemplary embodiment, the electronic device 100 is connected to the power supply apparatus 300 via the cable 200 at a VBUS voltage of 5 V or 9 V. Alternatively, the electronic device 100 may be connected at a VBUS voltage of 15 V, 20 V, or another.

In step S501, the electronic device 100 detects the connection of the power supply apparatus 300 to the connection unit 110. At this time the electronic device 100 is brought into the state at time T601 illustrated in FIG. 6, where a VBUS voltage of 5.0 V is supplied. The electronic device 100 may detect the connection of the power supply apparatus 300 through detection of the VBUS voltage by the voltage monitoring unit 1096 or through determination of the voltage level of the CC terminal by the connected device information acquisition unit 1091. The process does not proceed to the next step until the connection of the power supply apparatus 300 to the connection unit 110 is detected.

When the connection of the power supply apparatus 300 to the connection unit 110 is detected in step S501, the process proceeds to step S502. In step S502, the sub control unit 108 inhibits the startup of the main control unit 101 and the power source control unit 112 even if a startup button that is one of the operation members included in the operation unit 104 is pressed. As a result, the user is likely to think that the operation of the electronic device 100 cannot be started even though the user has pressed the startup button.

In step S503, the electronic device 100 waits for receipt of a power list (source capabilities) from the connected device information acquisition unit 303 of the power supply apparatus 300 by the connected device information acquisition unit 1091. The power list is a list indicating combinations of voltage and current suppliable by the power supply apparatus 300.

In step S504, the connected device information acquisition unit 1091 continues to wait for receipt of the power list (source capabilities) until a timeout occurs. In the first exemplary embodiment, if the electronic device 100 cannot still receive the power list from the power supply apparatus 300 after waiting for 620 ms, the electronic device 100 sends a reset signal from the connected device information acquisition unit 1091 to the connected device information acquisition unit 303 of the power supply apparatus 300. If the power list is not yet received after three repetitions of this operation, a timeout occurs. At the occurrence of the timeout (YES in step S504), the electronic device 100 terminates the connection process. At this time, the setting may be changed such that, when a startup switch that is one of the operation members included in the operation units 104 is controlled to start up the main control unit 101 and the power source control unit 112, the sub control unit 108 permits the startup of the main control unit 101 and the power source control unit 112.

In step S503, if the connected device information acquisition unit 1091 receives the power list (source capabilities) (YES in step S503), the process proceeds to step S505. The state that the connected device information acquisition unit 1091 receives the power list is illustrated at time T602 in FIG. 6. In the example of the first exemplary embodiment, since the power source control unit 305 of the power supply apparatus 300 can supply a voltage of 5 V or 9 V, an power list indicating two combinations of voltage and current of 15 W (5 V, 3 A) and 27 W (9 V, 3 A) is presented. The list varies depending on the capability of the power supply apparatus 300 but generally supports 5 V, 9 V, 15 V, and 20 V in this order.

In the first exemplary embodiment, upon checking the USB connection in step S501, the electronic device 100 sets the inhibition of startup of the main control unit 101 and the power source control unit 112 in step S502. Alternatively, the electronic device 100 may set the inhibition of startup described in step S502 at the timing when the power list in step S503 is received.

In step S505, the electronic device 100 sends a request for necessary power (Request) from the connected device information acquisition unit 1091 to the connected device information acquisition unit 303 of the power supply apparatus 300. The state that the electronic device 100 sends the request is illustrated at time T603 in FIG. 6. In the first exemplary embodiment, the electronic device 100 requests power of 15 W (5 V, 3 A) of the power supply apparatus 300. If the electronic device 100 requests a voltage higher than 5 V, for example, 9 V, 15 V, or 20 V, there may be a need to restrict the VBUS current to 2.5 W or less in order to satisfy USB standards. Thus, the electronic device 100 requests a 5-V voltage not requiring the VBUS current restriction. If the power request (Request) received by the connected device information acquisition unit 303 from the electronic device 100 indicates suppliable power, the power supply apparatus 300 transmits a voltage/current determination (Accept) to the connected device information acquisition unit 1091 of the electronic device 100.

In step S506, the connected device information acquisition unit 1091 of the electronic device 100 receives the voltage/current determination (Accept) from the connected device information acquisition unit 303 of the power supply apparatus 300. The state that the electronic device 100 receives the voltage/current determination is illustrated at time T604 in FIG. 6.

In step S507, the power supply apparatus 300 controls the power source control unit 305 under an instruction from the control unit 301. In this example, however, the VBUS voltage that is an output voltage from the power supply apparatus 300 is already 5 V and thus is not controlled (changed).

In step S508, upon completion of the control by the power source control unit 305 in step S507, the power supply apparatus 300 sends a completion notification (PS_RDY) from the connected device information acquisition unit 303 to the connected device information acquisition unit 1091 of the electronic device 100. The connected device information acquisition unit 1091 of the electronic device 100 receives the completion notification (PS_RDY) from the connected device information acquisition unit 303 of the power supply apparatus 300. The state that the electronic device 100 receives the completion notification is illustrated at time T605 in FIG. 6.

In step S509, the sub control unit 108 of the electronic device 100 acquires the voltage level of the battery 111 and determines whether the power source control unit 112 can be started up with power from the battery 111, depending on whether the acquired voltage level is equal to or greater than a predetermined value. In this case, the predetermined value is 5.5 V, for example. The predetermined value is not limited to 5.5 V and the voltage level of the battery 111 may be any level at which the electronic device 100 is operable with power from the battery 111. If the voltage level of the battery 111 is less than the predetermined value (NO in step S509), the process proceeds to step S510.

In step S510, the sub control unit 108 controls the charging control unit 1094 to charge the battery 111 with power of 15 W (5 V, 3 A) received from the VBUS terminal via the input control unit 1092. The sub control unit 108 controls the charging control unit 1094 to charge the battery 111 until the voltage of the battery 111 reaches a predetermined value higher than the predetermined value (5.5 V) described in step S509. The state that the voltage level of the battery 111 is higher than the predetermined value (5.5 V) is illustrated at time T605 in FIG. 6. The charging control unit 1094 continues charging until the voltage of the battery 111 reaches the predetermined value (NO in step S510). In the first exemplary embodiment, the predetermined value in step S510 is 5.8 V. The predetermined value (5.8 V) in step S510 is not limited to 5.8 V but may be any value that is sufficiently higher than the predetermined value (5.5 V) in step S509. Upon detecting that the voltage of the battery 111 has recovered to the predetermined value (5.8 V) by charging (YES in step S510), the charging control unit 1094 stops the charging of the battery 111, and the process proceeds to step S509. The state that the voltage of the battery 111 has recovered to the predetermined value (5.8 V) is illustrated at time T606 in FIG. 6.

In step S509, if the voltage level of the battery 111 is equal to or greater than the predetermined value (YES in step S509), the process proceeds to step S512.

In step S512, the sub control unit 108 controls the power supply control unit 1093 to decrease the VBUS restricted current to 0 A. The state that the VBUS restricted current is to be controlled to 0 A is illustrated at time T607 in FIG. 6. In the process up to step S512, the sub control unit 108 operates with power from the power supply control unit 1093 using the VBUS voltage. Since the VBUS restricted current is controlled to 0 A in step S512, the sub control unit 108 will continue the operation with power from the battery 111 in the subsequent steps.

In step S513, the sub control unit 108 controls the load test unit 113 to conduct a load test on the battery 111. The lord test is conducted in a time period from time T608 to time T609 in FIG. 6. The load test unit 113 calculates the amount of a drop in the voltage of the battery 111 by drawing 1 A from the battery 111 for a predetermined time period from time T608 to time T609, thereby measuring the degree of degradation of the battery 111. If the load test unit 113 conducts a load test in step S513 while receiving power supply from the power supply control unit 1093 without a restriction on the VBUS current in step S512, it is not possible to measure the degree of degradation of the battery 111. At the load test with the power supply from the power supply control unit 1093, the load test unit 113 will detect a voltage that has been converted from the VBUS voltage of 5V by the power supply control unit 1093 to be suitable for the power source control unit 112. Thus, in the first exemplary embodiment, after the VBUS current is restricted and brought into a state that allows the load test unit 113 to detect the voltage of the battery 111 in step S512, the load test unit 113 conducts the load test in step S513.

As a result of the load test in step S513, if the sub control unit 108 determines that the internal resistance of the battery 111 is greater than a predetermined value and the battery 111 is degraded (NO in step S514), the sub control unit 108 terminates the process without permitting the startup of the control unit 101 and the power source control unit 112. In contrast, as a result of the load test in step S513, if the sub control unit 108 determines that the internal resistance of the battery 111 is equal to or less than the predetermined value and the battery 111 is not degraded (YES in step S514), the sub control unit 108 permits the startup of the control unit 101 and the power source control unit 112. The state that the startup of the control unit 101 and the power source control unit 112 is permitted is illustrated at time T610 in FIG. 6.

In step S515, when the startup switch which is one of the members included in the operation units 104 is controlled to start up the control unit 101 and the power source control unit 112 (YES in step S515), the sub control unit 108 controls the control unit 101 and the power source control unit 112 to start up.

Upon completion of the startup of the control unit 101 and the power source control unit 112 in step S515, then in step S516, the electronic device 100 sends a request for necessary power (Request) from the connected device information acquisition unit 1091 to the connected device information acquisition unit 303 of the power supply apparatus 300. The state that the request is send is illustrated at time T611 in FIG. 6. In the first exemplary embodiment, the electronic device 100 requests power with a higher voltage than 5V, for example, power of 15 W (5 V, 3 A) of the power supply apparatus 300. In this example, the electronic device 100 may request the power supply apparatus 300 of power in another combination of voltage and current as long as the combination is in the power list received in step S503. If the power request (Request) from the electronic device 100 received by the connected device information acquisition unit 303 indicates suppliable power, the power supply apparatus 300 transmits a voltage/current determination (Accept) to the connected device information acquisition unit 1091 of the electronic device 100.

In step S517, the connected device information acquisition unit 1091 of the electronic device 100 receives the voltage/current determination (Accept) from the connected device information acquisition unit 303 of the power supply apparatus 300. The state that the voltage/current determination is received is illustrated at time T612 in FIG. 6. Usually, when the electronic device 100 receives the voltage/current determination (Accept), the sub control unit 108 is to set the VBUS current restriction with respect to the power supply control unit 1093 within 15 ms. In the first exemplary embodiment, however, the VBUS current is restricted in advance in step S512.

In step S518, the power supply apparatus 300 controls the power source control unit 305 under an instruction from the control unit 301 to change the VBUS voltage that is an output voltage from the power supply apparatus 300 from 5 V to 9 V. The state that the VBUS voltage is to be changed from 5 V to 9 V is illustrated at time T613 in FIG. 6.

In step S519, upon completion of the control by the power source control unit 305 in step S518, the power supply apparatus 300 sends a notification of completion (PS_RDY) from the connected device information acquisition unit 303 to the connected device information acquisition unit 1091 of the electronic device 100. The connected device information acquisition unit 1091 of the electronic device 100 receives the notification of completion (PS_RDY) from the connected device information acquisition unit 303 of the power supply apparatus 300. The state that the completion notification is received is illustrated at time T614 in FIG. 6.

In step S520, the sub control unit 108 cancels the restriction of power received from the VBUS terminal, and requests the power supply control unit 1093 to change the VBUS restricted current to the current value specified in the power request (Request). In the first exemplary embodiment, the sub control unit 108 requests a change of the VBUS restricted current from 0 A to 3.0 A. When the power supply control unit 1093 changes the VBUS restricted current, the electronic device 100 can operate with power supply from the power supply apparatus 300. The state that the VBUS restricted current is to be changed from 0 A to 3.0 A is illustrated at time T615 in FIG. 6.

As described above, according to the first exemplary embodiment, while a 5-V voltage from the power supply apparatus 300 is requested and power from the VBUS is restricted, the load test of the battery 111 is conducted and the electronic device 100 is started up. Then a 9-V voltage from the power supply apparatus 300 is requested and power supply is started. With the configuration, it is possible to determine whether the battery can start up a system in conformity with a 2.5-W restriction under USB PD standard. This avoids shortage of power supply in the electronic device 100 before starting the power supply in conformity with USB PD standard.

Second Exemplary Embodiment

Various functions, processes, or methods described in the first exemplary embodiment can be implemented through the execution of programs by a personal computer, a microcomputer, a central process unit (CPU), or a microprocessor. Hereinafter, in a second exemplary embodiment, the personal computer, microcomputer, central process unit (CPU), or microprocessor will be called "computer X". In addition, in the second exemplary embodiment, programs for controlling the computer X and implementing the various functions, processes, or methods will be called "programs Y".

The various functions, processes, or methods described above in the first exemplary embodiment are implemented by the computer X executing the programs Y. In this case, the programs Y are supplied to the computer X via a computer-readable storage medium. The computer-readable storage medium in the second exemplary embodiment includes at least one of a hard disk device, magnetic storage device, optical storage device, magneto-optical storage device, memory card, volatile memory, in-volatile memory, or the like. The computer-readable storage medium in the second exemplary embodiment is a non-transitory storage medium.

While aspects of the disclosure are described with reference to exemplary embodiments, it is to be understood that the aspects of the disclosure are not limited to the exemplary embodiments. The scope of the following claims is to be accorded the broadest interpretation so as to encompass all such modifications and equivalent structures.

This application claims the benefit of Japanese Patent Application No. 2020-079316, filed Apr. 28, 2020, which is hereby incorporated by reference herein in its entirety.

What is claimed is:

1. A device comprising:
a connector;
a CPU; and
a memory storing a program which, when executed by the CPU, causes the CPU to function as:
a power receiving unit that receives power from a power supply apparatus connected to the connector;
a load test unit that performs a load test of a battery supplying power to the device and determines whether to permit startup of the device using the power of the battery; and
a control unit that requests a first voltage to the power supply apparatus connected to the connector and restricts power received by the power receiving unit,
wherein the control unit checks a determination result of the load test unit in the restriction of the power received by the power receiving unit and starts up the device in accordance with an instruction for starting up the device from a user if it is determined to permit startup of the device using the battery by the load test unit,
wherein the control unit requests a second voltage higher than the first voltage to the power supply apparatus connected to the connector after the device is started up in the restriction of the power received by the power receiving unit, and
wherein the control unit cancels the restriction of the power received by the power receiving unit in accordance with a predetermined notification, which is relating to a completion of supply of the second voltage by the power supply apparatus from the power supply apparatus and controls the power receiving unit to receive the second voltage.

2. The device according to claim 1, further comprising:
a first terminal for receiving power from the power supply apparatus; and
a second terminal for receiving information on power supply capability of the power supply apparatus.

3. The device according to claim 1, wherein the first voltage corresponds to 5 V.

4. The device according to claim 1, wherein the second voltage corresponds to 5 V, 9 V, 15 V, or 20 V.

5. The device according to claim 1, wherein the load test unit determines whether to permit startup of the device using the battery supplying power to the device, based on whether an internal resistance of the battery is equal to or greater than a predetermined value.

6. A method for controlling a power receiving device comprising:
receiving power from a power supply apparatus connected to a connector of the power receiving device;
performing a load test of a battery supplying power to the power receiving device and determining whether to permit startup of the power receiving device using power of the battery;
requesting a first voltage to the power supply apparatus connected to the connector and restricting power received from the power supply apparatus;
checking a determination result of the load test in the restriction of the power received from the power supply apparatus and starting up the power receiving device in accordance with an instruction for starting up the power receiving device from a user if it is determined to permit startup of the power receiving device using the battery by the load test;
requesting a second voltage higher than the first voltage to the power supply apparatus connected to the connecter after the power receiving device is started up in the restriction of the power received from the power supply apparatus; and
cancelling the restriction of the power received by the power receiving device in accordance with a predetermined notification, which is relating to a completion of supply of the second voltage by the power supply apparatus, from the power supply apparatus and controlling the power receiving device to receive the second voltage.

7. The method according to claim 6, further comprising:
receiving power from the power supply apparatus via a first terminal of the power receiving device; and
receiving information on power supply capability of the power supply apparatus via a second terminal of the power receiving device.

8. The method according to claim 6, wherein the first voltage corresponds to 5 V.

9. The method according to claim 6, wherein the second voltage corresponds to 5 V, 9 V, 15 V, or 20 V.

10. The method according to claim 6, wherein the determining determines whether to permit startup of the power receiving device using the battery supplying power to the power receiving device, based on whether an internal resistance of the battery is equal to or greater than a predetermined value.

11. A non-transitory storage medium that stores a program causing a computer to execute a method, the method comprising:
receiving power from a power supply apparatus connected to a connector of the power receiving device;
performing a load test of a battery supplying power to the power receiving device and determining whether to permit startup of the power receiving device using power of the battery;
requesting a first voltage to the power supply apparatus connected to the connector and restricting power received from the power supply apparatus;
checking a determination result of the load test in the restriction of the power received from the power supply apparatus and starting up the power receiving device in accordance with an instruction for starting up the power receiving device from a user if it is determined to permit startup of the power receiving device using the battery by the load test;
requesting a second voltage higher than the first voltage to the power supply apparatus connected to the connecter after the power receiving device is started up in the restriction of the power received from the power supply apparatus; and
cancelling the restriction of the power received by the power receiving device in accordance with a predetermined notification, which is relating to a completion of supply of the second voltage by the power supply apparatus, from the power supply apparatus and controlling the power receiving device to receive the second voltage.

12. The device according to claim 1, wherein the load test unit detects a voltage of the battery by drawing a predetermined current from the battery in the restriction of the power received by the power receiving unit and determines whether to permit the startup of the device using the power of the battery in accordance with the detected voltage.

13. The device according to claim 1, wherein the power receiving unit receives power from the power supply apparatus connected to the connector in accordance with Universal Serial Bus Power Delivery (USB PD) standard, and the predetermined notification relating to the completion of supply of the second voltage by the power supply apparatus is PS_RDY.

14. The device according to claim 1, wherein the control unit requests the second voltage to the power supply apparatus based on power supply capability information received from the power supply apparatus.

15. The device according to claim 1, wherein the program, when executed by the CPU, further causes the CPU to function as:
a charging unit that charges the battery with the power received by the power receiving unit,
wherein the control unit does not restrict the power received by the power receiving unit and controls the charging unit to charge the battery with the power, which is not restricted, received by the power receiving unit if a voltage level of the battery is less than a predetermined voltage, and restricts the power received by the power receiving unit in accordance with reaching of the voltage level of the battery to the predetermined voltage.

* * * * *